(12) United States Patent
Kwak et al.

(10) Patent No.: US 9,273,912 B2
(45) Date of Patent: Mar. 1, 2016

(54) HEAT DISSIPATION DEVICE FOR ELECTRONIC CONTROLLERS

(71) Applicant: Hyundai Motor Company, Seoul (KR)

(72) Inventors: Jin Woo Kwak, Gyeongsangbuk-do (KR); Kyong Hwa Song, Seoul (KR); Gyung Bok Kim, Seoul (KR); In Chang Chu, Seoul (KR)

(73) Assignee: Hyundai Motor Company, Seoul (KR)

( * ) Notice: Subject to any disclaimer, the term of this patent is extended or adjusted under 35 U.S.C. 154(b) by 188 days.

(21) Appl. No.: 14/080,109

(22) Filed: Nov. 14, 2013

(65) Prior Publication Data

US 2015/0040583 A1 Feb. 12, 2015

(30) Foreign Application Priority Data

Aug. 6, 2013 (KR) .................. 10-2013-0092875

(51) Int. Cl.
*F28F 3/12* (2006.01)
(52) U.S. Cl.
CPC ........................ *F28F 3/12* (2013.01)
(58) Field of Classification Search
CPC ............ F28F 3/12; F28F 21/00; F28F 27/00; F28F 2260/00; F28D 9/00; F28D 13/00
USPC ............................................. 62/3.2, 3.3, 159
See application file for complete search history.

(56) References Cited

U.S. PATENT DOCUMENTS

| | | | |
|---|---|---|---|
| 4,585,523 A * | 4/1986 | Giddings | 202/236 |
| 4,738,113 A * | 4/1988 | Rudick | 62/3.5 |
| 5,399,416 A * | 3/1995 | Bujard | 428/209 |
| 5,555,878 A * | 9/1996 | Sparkman | 126/657 |
| 5,561,981 A * | 10/1996 | Quisenberry et al. | 62/3.7 |
| 6,158,502 A * | 12/2000 | Thomas | 165/104.26 |
| 7,697,882 B2 * | 4/2010 | Hirst et al. | 399/400 |
| 2007/0241066 A1 * | 10/2007 | Bishop et al. | 210/774 |
| 2009/0044576 A1 * | 2/2009 | Moschutz | 68/5 C |
| 2010/0200199 A1 * | 8/2010 | Habib et al. | 165/104.26 |
| 2011/0094725 A1 * | 4/2011 | Oman et al. | 165/202 |
| 2011/0111546 A1 * | 5/2011 | Nurnus et al. | 438/54 |
| 2012/0152511 A1 | 6/2012 | Chang et al. | |
| 2012/0312031 A1 * | 12/2012 | Olsen et al. | 62/3.62 |

FOREIGN PATENT DOCUMENTS

| | | |
|---|---|---|
| JP | 4687541 B2 | 5/2011 |
| KR | 10-1999-0085871 A | 12/1999 |
| KR | 10-2008-0077448 | 8/2008 |
| KR | 10-2009-0080184 | 7/2009 |
| KR | 10-2009-0088134 A | 8/2009 |
| KR | 10-2010-0049485 A | 5/2010 |
| KR | 10-2010-0055593 | 5/2010 |

\* cited by examiner

*Primary Examiner* — Mohammad M Ali
(74) *Attorney, Agent, or Firm* — Mintz Levin Cohn Ferris Glovsky and Popeo, P.C.; Peter F. Corless

(57) ABSTRACT

A heat dissipation device for electronic controllers, is provided and includes a housing that has a hollow portion into which a working fluid for heat transfer and dissipation is filled. The housing of the electronic controller is formed to have the hollow portion using the material containing the heat-conductive filler and the heat transfer working fluid is filled in the hollow portion, to improve the cooling efficiency and achieving the weight reduction. By forming the condensation unit that condenses the vaporized working fluid in the upper end portion relative to the working fluid filled in the hollow portion of the housing, the heat exchange effect of the working fluid may be maximized.

6 Claims, 3 Drawing Sheets

# HEAT DISSIPATION DEVICE FOR ELECTRONIC CONTROLLERS

CROSS-REFERENCE TO RELATED APPLICATION

This application claims under 35 U.S.C. §119(a) the benefit of Korean Patent Application No. 10-2013-0092875 filed on Aug. 6, 2013, the entire contents of which are incorporated herein by reference.

BACKGROUND (a) Technical Field

The present disclosure relates to a heat dissipation device for electronic controllers, and more particularly, to a heat dissipation device for electronic controllers, in which a housing of an electronic controller has a hollow portion and a working fluid for heat transfer and dissipation is filled into the hollow portion.

(b) Background Art

Recently, the number of various electric and electronic parts (hereinafter, referred to as electronic controllers) mounted within vehicles has increased and the electronic controllers have also been integrated. Therefore, weight reduction and safety, especially, heat dissipation, of cooling systems for cooling the electronic controllers have emerged as a serious issue. A conventional cooling system for cooling various electronic controllers mounted within vehicles will be described in brief.

The conventional cooling system is usually of a water cooling type since an air cooling type has a lower cooling efficiency than the water cooling type and thus is not applicable to high heat-emission parts such as a battery, an inverter, and any other similar and/or suitable parts. The conventional cooling system, for example, a cooling system that cools a motor controller of a fuel-cell vehicle has a water-cooling structure that uses a heat exchanger having a closed loop, and an inverter system of an eco-friendly vehicle uses a direct liquid cooling system to cool an IGBT power module.

As illustrated in FIGS. 1A and 1B, a conventional cooling system of the water-cooling type has a heat sink for heat dissipation integrally attached to a power device of each controller, wherein a cooling tube in which a working fluid is circulated is disposed adjacent to the heat sink.

However, in the conventional cooling system of the water cooling type weight of each component of the cooling system increases, there is a difficulty in molding the cooling tube to form a cooling water circulation channel, a limitation in anti-corrosion property of metallic materials such as for the heat sink exists, and leakage of the cooling water may occur.

SUMMARY

Accordingly, the present invention provides a heat dissipation device for electronic controllers, in which a housing of an electronic controller may be formed to have a hollow portion using a material that contains a heat transfer filler and a heat transfer working fluid maybe filled into the hollow portion, to improve cooling efficiency compared to cooling systems of an air-cooling type and a water-cooling type for electronic controllers of vehicles and to reduce a weight of a cooling system compared to a cooling system of a water-cooling type.

Various aspects of the present invention also provide a heat dissipation device for electronic controllers, in which a cooling unit in the shape of a heat dissipation pin or a cooling unit that includes a thermoelectric element for efficient condensation may be attached to an upper portion relative to a working fluid filled into a hollow portion of a housing, that is, to an upper end portion of the hollow portion, as a condensation unit that condenses a vaporized working fluid, thereby maximizing the heat exchange effect of the working fluid.

According to one of various aspects of the present invention, a heat dissipation device for an electronic controller is provided, in which a housing of the electronic controller may be formed using a heat-conductive material to have a hollow portion and a heat transfer working fluid may be filled into the hollow portion.

The housing may be formed of a heat-conductive engineering plastic material that contains a heat-conductive filler. The heat-conductive filler may be contained in a range of about 30 wt % to 60 wt % with respect to a total weight of the heat-conductive engineering plastic material. In addition, the heat-conductive filler may include graphite or boron nitride formed of plate-shape particles. A thermoelectric element that condenses a vaporized working fluid may be disposed in an upper end portion of the hollow portion. The working fluid may include one selected from among acetone, ammonia, methanol, water, and mercury, which are vaporized upon heat absorption, and a combination of two or more selected from among acetone, ammonia, methanol, water, and mercury. A plurality of ribs that reinfornce a rigidity of the hollow portion may be formed integrally on a bottom surface of the hollow portion to extend upwardly.

BRIEF DESCRIPTION OF THE DRAWINGS

The above and other features of the present invention will now be described in detail with reference to an exemplary embodiment thereof illustrated the accompanying drawings which are given hereinbelow by way of illustration only, and thus are not limitative of the present invention, and wherein.

DETAILED DESCRIPTION

Figure 1A:
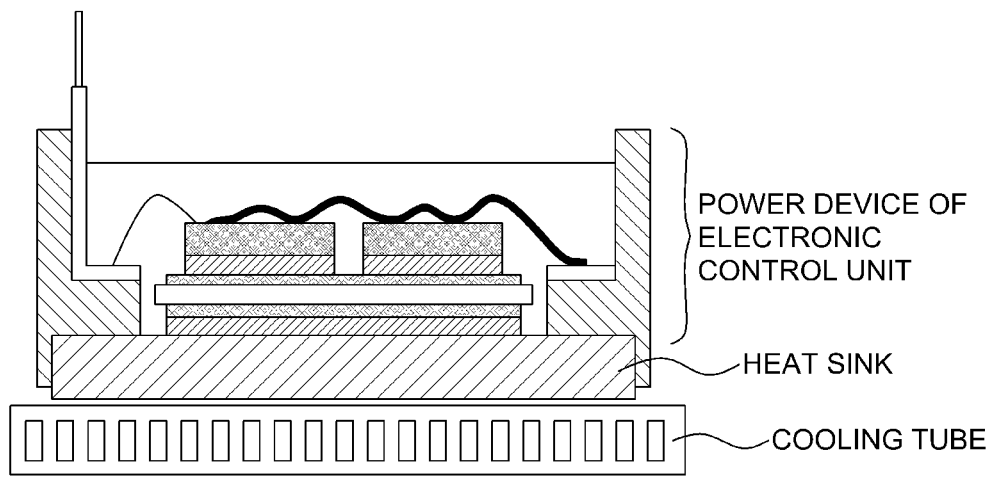
FIGS. 1A and 1B are exemplary diagrams showing conventional heat dissipation means for electronic controllers according to the related art.
Figure 1B:
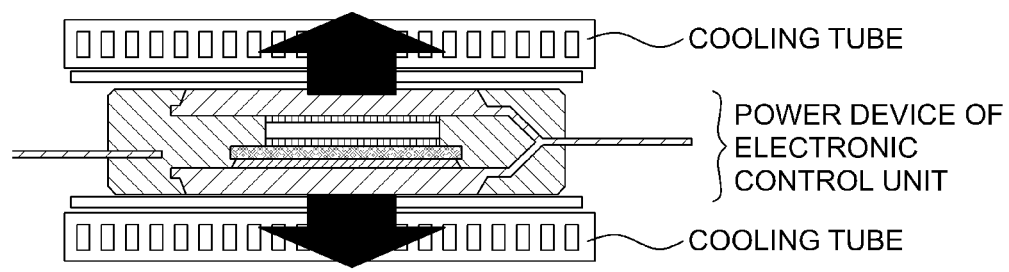

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles, fuel cell vehicles, and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, the present invention will be described in detail with reference to the accompanying drawings to allow those of ordinary skill in the art to easily carry out the present invention.

Figure 2:
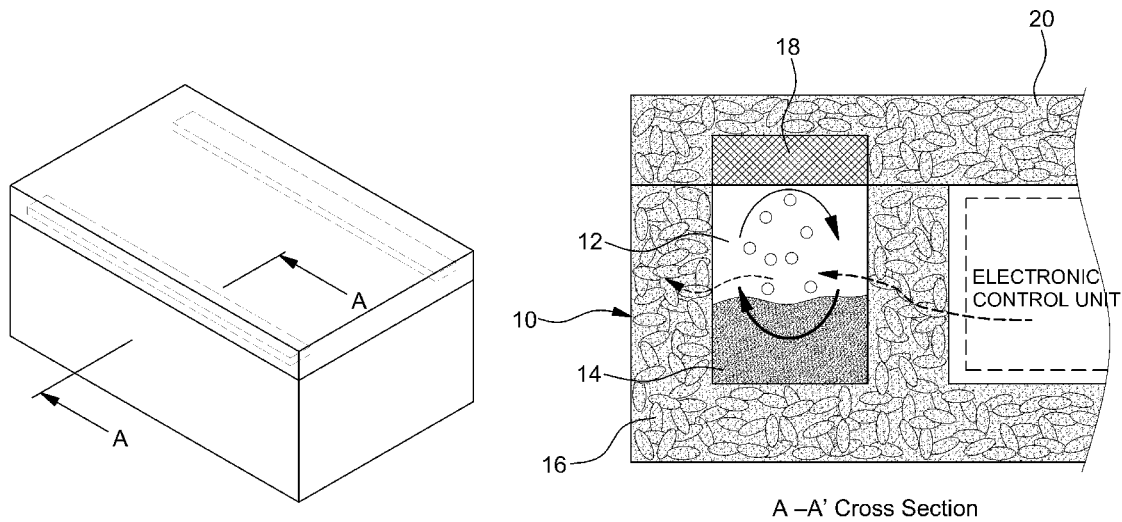
FIG. 2 is an exemplary diagram showing a heat dissipation device for electronic controllers according to an exemplary embodiment of the present invention.

In FIG. 2, reference numeral 10 indicates a housing of an electronic controller. The housing 10 encloses electronic controllers (e.g., a motor controller of a fuel-cell vehicle, a battery of a hybrid vehicle, an inverter, an IGBT power module, and any other similar and/or suitable units) for protection. For lighter weight than a conventional metallic material, the housing 10 may be manufactured with a heat-conductive plastic material. More specifically, to transfer heat generated in an electronic controller to the exterior for emission, the housing 10 may be molded with a heat-conductive engineering plastic material that contains a heat-conductive filler 16, and the heat-conductive filler 16 may be contained in a range of about 30 wt % to 60 wt % with respect to a total weight of the heat-conductive engineering plastic material.

The heat-conductive filler 16 may include graphite or boron nitride formed of plate-shape particles, or any other similar and/or suitable materials having heat conductivity and including plate-shape particles. In particular, the housing 10 may be formed to enclose an electronic controller using a heat-conductive material and to have a hollow portion 12 therein. The hollow portion 12 may be formed inside walls of four sides of the housing 10 to have an open top portion, to divide the walls of the four sides of the housing 10 into outer walls and inner walls.

After the housing 10 is formed to have the hollow portion 12, a heat transfer working fluid 14 may be filled into the hollow portion 12 through the open top portion of the hollow portion 12. This working fluid 14 may include one selected from among acetone, ammonia, methanol, water, and mercury, which are vaporized upon heat absorption, and a combination of two or more selected from among them. Therefore, heat generated in an electronic controller may be dissipated to the working fluid 14 in the hollow portion 12 through the heat-conductive filler 16 contained in the heat-conductive engineering plastic material that forms the inner walls of the housing 10, and the working fluid 14 may be vaporized by absorbing heat.

The heat-conductive filler 16 contained in the heat-conductive engineering plastic material of the outer walls of the housing 10 may dissipate a part of heat absorbed in the working fluid 14 to the exterior and prevent vaporized gas molecules or liquid molecules of the working fluid 14 from leaking to the exterior. In other words, as illustrated in FIG. 4, the heat-conductive filler 16 formed of plate-shape particles may maximize a path along which molecules of the working fluid 14 move to the exterior, thus preventing leakage of the molecules of the working fluid 14 to the exterior of the housing 10.

Figure 4:
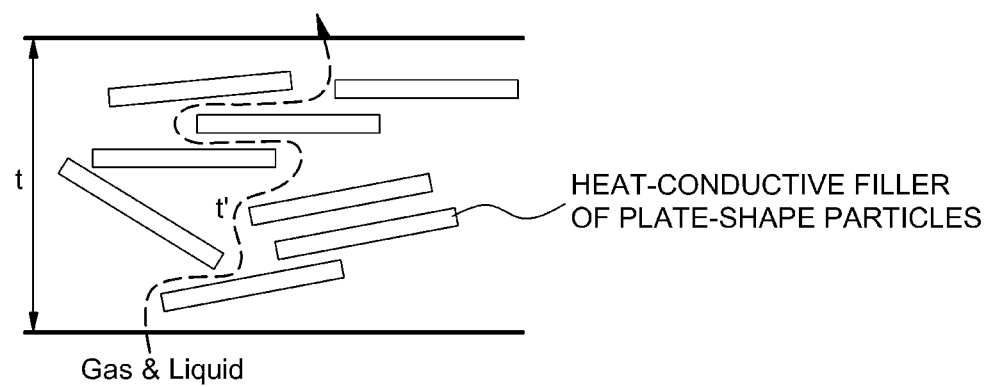
FIG. 4 is an exemplary diagram for describing a role of a heat transfer filler applied to a heat dissipation device for electronic controllers according to an exemplary embodiment of the present invention.

In particular, as shown in FIG. 4, when the heat-conductive filler particles are not contained therein, the molecule moving path of the working fluid 14 is 't', and when the heat-conductive filler is contained therein, the moving path may increase by 't', and thus the movement of the molecules of the working fluid 14 to the exterior may be prevented when the heat conductive filler is aligned in plane. In particular, the heat-conductive filler 16 used in the housing 10 may operate as a medium for heat dissipation of an electronic controller and at the same time, may prevent the molecules of the working fluid 14 from leaking to the exterior.

In the open top portion of the hollow portion 12 of the housing 10, a general thermoelectric element 18 may be disposed to condense the vaporized working fluid 14. The thermoelectric element 18 may be attached to a top surface or a bottom surface of a cover housing 20, causing the working fluid 14 to be disposed above a condensing space of the hollow portion 12 in which the working fluid 14 is filled when the cover housing 20 is assembled to cover the housing 10.

Therefore, the heat generated in the electronic controller may be dissipated to the working fluid 14 in the hollow portion 12 via the heat-conductive filler 16 contained in the heat-conductive engineering plastic material of the inner walls of the housing 10, and the working fluid 14 may absorb the heat and vaporize toward the thermoelectric element 18. Then, the vaporized working fluid 14 may be condensed by a cooling action of the thermoelectric element 18, to return the working fluid 14 to the original filling position along the walls of the hollow portion 12.

Figure 3:
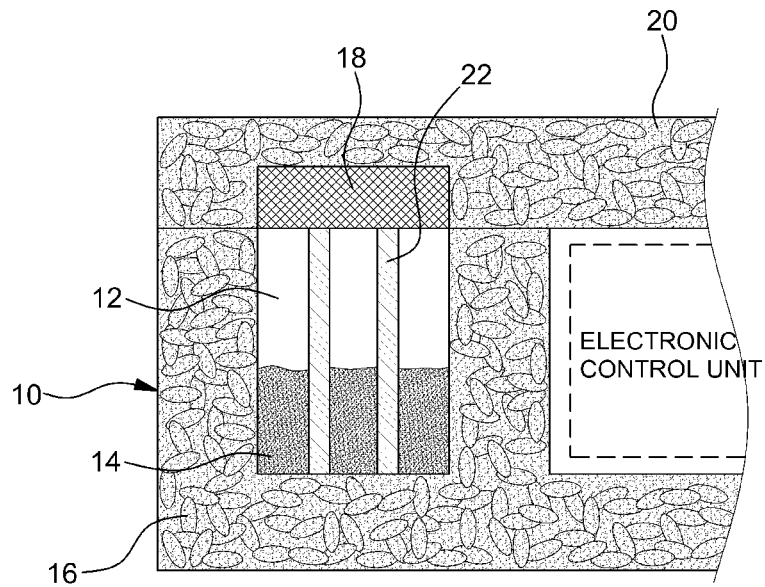
FIG. 3 is an exemplary diagram showing a heat dissipation device for electronic controllers according to another exemplary embodiment of the present invention.

According to another exemplary embodiment of the present invention, considering that as the hollow portion 12 is formed inside the housing 10, the rigidity of the housing 10 may be weakened, a rib 22 for reinforcement may be integrally formed in the hollow portion 12. As illustrated in FIG. 3, a plurality of ribs 22 may be integrally formed on the bottom surface of the hollow portion 12 of the housing 10 to extend upwardly, thus reinforcing the rigidity of the hollow portion 12. The plurality of ribs 22 may serve as barriers for dividing the hollow portion 12 into several spaces, and the working fluid 14 may be evenly filled over the hollow portion 12 divided into several spaces, to cause vaporization and condensation to be repeated for heat dissipation of the electronic controller.

According to the present invention, the housing of the electronic controller may be formed to have the hollow portion using the material containing the heat-conductive filler and the heat transfer working fluid may be filled in the hollow portion, to improve the cooling efficiency when compared to the conventional cooling system of the air cooling type and the water cooling type and achieving the weight reduction in comparison to the water cooling type.

In particular, the cooling unit in the shape of the heat dissipation pin or the cooling unit that includes the thermoelectric element for efficient condensation may be attached to the upper portion relative to the working fluid filled into the hollow portion of the housing, that is, to the upper end portion of the hollow portion, as the condensation unit that condenses the vaporized working fluid, thereby maximizing dissipation of the heat generated in the electronic controller based on the heat exchange of the working fluid. Additionally, by integrally forming the separate ribs in the hollow portion of the housing, the rigidity of the housing may be reinforced.

While the exemplary embodiments of the present invention have been described in detail, the scope of the present invention is not limited to the foregoing exemplary embodiment and various modifications and improvements made by those of ordinary skill in the art using the basic concept of the present invention defined in the appended claims are also included in the scope of the present invention.

| Description of Reference Numerals | |
| --- | --- |
| 10: Housing | 12: Hollow Portion |
| 14: Working Fluid | 16: Heat-Conductive Filler |
| 18: Thermoelectric Element | 20: Cover Housing |
| 22: Rib | |

What is claimed is:

1. A heat dissipation device for an electronic controller, comprising:
    a housing formed using a heat-conductive material to have a hollow portion,
    wherein a heat transfer working fluid is filled into the hollow portion,
    wherein the housing is formed of a heat-conductive engineering plastic material that contains a heat-conductive filler, and
    wherein the heat-conductive filler is aligned in a plane to prevent the molecules of the working fluid from leaking to the exterior.

2. The heat dissipation device of claim 1, wherein the heat-conductive filler is contained in a range of about 30 wt % to 60 wt % with respect to a total weight of the heat-conductive engineering plastic material.

3. The heat dissipation device of claim 2, wherein the heat-conductive filler includes graphite or boron nitride formed of plate-shape particles.

4. The heat dissipation device of claim 1, further comprising:
    a thermoelectric element that condenses a vaporized working fluid is disposed in an upper end portion of the hollow portion.

5. The heat dissipation device of claim 1, wherein the working fluid includes one selected from a group consisting of: acetone, ammonia, methanol, water, and mercury, that are vaporized upon heat absorption, and a combination of two or more selected from a group consisting of: acetone, ammonia, methanol, water, and mercury.

6. The heat dissipation device of claim 1, further comprising:
    a plurality of ribs that reinforce a rigidity of the hollow portion and are formed integrally on a bottom surface of the hollow portion to extend upwardly.

* * * * *